(12) United States Patent
Sim

(10) Patent No.: US 8,173,287 B2
(45) Date of Patent: May 8, 2012

(54) TEMPERATURE COMPENSATED CURRENT MEASURING DEVICE AND BATTERY PACK USING THE SAME

(75) Inventor: Sesub Sim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 547 days.

(21) Appl. No.: 12/238,563

(22) Filed: Sep. 26, 2008

(65) Prior Publication Data

US 2009/0087725 A1 Apr. 2, 2009

(30) Foreign Application Priority Data

Sep. 28, 2007 (KR) ................. 10-2007-0097982

(51) Int. Cl.
*H01M 10/48* (2006.01)
*G01R 1/02* (2006.01)
*G01R 11/32* (2006.01)
(52) U.S. Cl. ............ 429/92; 429/90; 324/130; 324/134
(58) Field of Classification Search ............... 429/90
See application file for complete search history.

(56) References Cited

U.S. PATENT DOCUMENTS

| 3,852,652 | A | * | 12/1974 | Jasinski | 320/150 |
| 6,034,507 | A | * | 3/2000 | Ikawa et al. | 320/136 |
| 6,528,960 | B1 | * | 3/2003 | Roden et al. | 318/400.32 |
| 2004/0212342 | A1 | * | 10/2004 | Batson | 320/107 |
| 2005/0127918 | A1 | | 6/2005 | Kutkut et al. | |
| 2006/0164042 | A1 | | 7/2006 | Sim | |

FOREIGN PATENT DOCUMENTS

| CN | 1811482 A | 8/2006 |
| KR | 10-2002-0090756 | 12/2002 |

OTHER PUBLICATIONS

Lee et al., Machine translation of KR 2002090756 A, Dec. 2002.*
SIPO Office action dated Dec. 31, 2010, issued in corresponding Chinese application No. CN 200810167105, 7 pages.
English translation of SIPO Office action dated Dec. 31, 2010 issued in CN 200810167105, 12 pages.

* cited by examiner

*Primary Examiner* — Basia Ridley
*Assistant Examiner* — Sean P Cullen
(74) *Attorney, Agent, or Firm* — Christie, Parker & Hale, LLP

(57) ABSTRACT

A battery pack, and more particularly, a temperature compensated current measuring device which can accurately measure an actual current flowing in a circuit of a charging/discharging path in the battery pack. The temperature compensated current measuring device includes a conductor in which current flows, a temperature sensor disposed around the conductor to measure a temperature of the conductor, and a temperature compensated current detection circuit part electrically connected to two positions of the conductor to measure a voltage between the two positions, electrically connected to the temperature sensor to measure a temperature of the conductor, and measuring the current flowing in the conductor by using the measured temperature and the voltage as an input signal. Thus, it is possible to accurately calculate an actual charging/discharging current with the temperature compensated current measuring device and effectively control the charging capacity of the battery pack.

11 Claims, 5 Drawing Sheets

TEMPERATURE COMPENSATED CURRENT MEASURING DEVICE AND BATTERY PACK USING THE SAME

CROSS-REFERENCE TO RELATED APPLICATION

This application claims the benefit of Korean Application No. 2007-97982, filed Sep. 28, 2007, in the Korean Intellectual Property Office, the disclosure of which is incorporated herein by reference.

BACKGROUND OF THE INVENTION

1. Field of the Invention

Aspects of the present invention relate to a battery pack, and more particularly, to a temperature compensated current measuring device which can measure current flowing in a conductor, and a battery pack using the same.

2. Description of the Related Art

Generally, a secondary battery can be rechargeable and thus repeatedly usable, which is different from a primary battery. The secondary battery is generally used as the main power of portable devices for communication, information processing, and audio/video. Currently, interests in the secondary battery are being increased and the development of the secondary battery is also being rapidly performed. The main reason thereof is because the secondary battery is a super-light, high energy density, and environment-friendly battery with a high output voltage and a low electric discharge rate, and also because the secondary battery is a power source with a comparatively longer lifespan.

Secondary batteries are classified into nickel-metal hydride (Ni-MH) batteries, lithium ion (Li-ion) batteries, and the like, based on electrode active materials. Particularly, the lithium ion (Li-ion) batteries may be classified based on the type of electrolyte, for example, when liquid electrolyte is used and when solid electrolyte or gel-type electrolyte is used. Also, the secondary batteries are classified into various types, such as a can type, a pouch type, and the like, based on the shape of a can within which the electrode assembly is received.

The weight-to-energy density of the lithium ion (Li-ion) battery is much greater than the primary battery and thus can be manufactured as a super-light battery. Also, the average voltage of the lithium ion (Li-ion) battery for each cell is about 3.6V and is compact by three times, in comparison with the average voltage, about 1.2V, of other secondary batteries, such as a Ni—Cd battery and a nickel-metal hydride (Ni-MH) battery. Also, the lithium ion battery has an electric discharge rate of less than 5% a month in the temperature of about 20° C., which is about one third of the electric discharge rate of the Ni—Cd battery and the nickel-metal hydride battery. Also, the lithium ion battery does not use heavy metal, such as cadmium (Cd) and mercury (Hg) and thus is environment-friendly. Also, the lithium ion battery can be rechargeable at least one thousand times in a normal state. Accordingly, with developments in information communication technologies, there is an increase in research on secondary batteries based on the above-described advantages.

Also, in the situation of a rechargeable secondary battery, a plurality of secondary batteries is mounted to a portable electronics product, such as a notebook personal computer (PC) in a form of a pack, and thereby used. In this instance, a charging/discharging control circuit is embedded in the pack-type secondary battery and controls general matters about charging/discharging the battery. Also, the charging/discharging control circuit prevents overcharging or over-discharging of the battery, thereby improving battery stability. Also, the charging/discharging control circuit measures the current in the situation of charging/discharging of the battery, and thereby controlling the charging and discharging.

In this instance, the charging/discharging control circuit has an external resistor located at one position of a conductor in which current flows, and measures the current flowing in the external resistor by measuring the resistance value of the external resistor and a voltage value between both ends of the external resistor. When high-current flows in the external resistor, the voltage value between both ends of the external resistor also significantly changes.

Accordingly, a battery pack, such as a high-capacity battery pack, and the like, flows high-current in the external resistor. According to the flow of the high-current, the voltage value across both ends of the external resistor significantly changes. However, when the measurement scope of the voltage value is extremely broad, the actual current flowing in the external resistor may not be accurately measured. Accordingly, charging/discharging of the battery may be ineffectively controlled.

SUMMARY OF THE INVENTION

Aspects of the present invention are conceived to solve the above-described and/or other problems in the conventional art and thus an aspect of the present invention is to provide a temperature compensated current measuring device that can accurately measure the actual current flowing in a circuit.

An aspect of the present invention is to provide a battery pack that can effectively calculate a charge/discharge capacity and a control charging current of a battery based on the accurate measurement of the current without an expansive external resistor.

According to an aspect of the present invention, there is provided a temperature compensated current measuring device including a conductor in which current flows, a temperature sensor disposed around the conductor, to measure a temperature of the conductor, and a temperature compensated current detection circuit part electrically connected to two positions of the conductor, to measure a voltage between the two positions, electrically connected to the temperature sensor, to measure temperature of the conductor, and to measure the current flowing in the conductor by using the measured temperature and the voltage as an input signal.

According to an aspect of the present invention, the temperature compensated current detection circuit part may include a voltage detection part connected to the two positions of the conductor, to measure the voltage between the two positions, a temperature detection part electrically connected to the temperature sensor, to detect a voltage value corresponding to the temperature measured by the temperature sensor, and an arithmetic operation part converting the voltage value corresponding to the temperature, measured by the temperature detection part, into a resistance value of the conductor, and calculating a current capacity flowing in the conductor by using the resistance value and the voltage between the two positions of the conductor measured by the voltage detection part.

Furthermore, the temperature compensated current detection circuit part may include a transducer electrically connected to the temperature sensor, to convert a detected resistance value of the temperature sensor into a voltage value, an analog-to-digital (A/D) converter connected to the two positions of the conductor, to convert a measured analog voltage into a digital voltage, and a micro controller unit electrically connected to the transducer and the A/D converter, to receive the voltage value output from the transducer and the A/D converter.

According to another aspect of the present invention, there is provided a battery pack using the temperature compensated current measuring device, the battery pack including: a rechargeable battery; a charging/discharging switching element electrically connected to a high-current of the battery; a conductor electrically connected to a high-current path in which current for charging/discharging of the battery flows; a temperature sensor disposed around the conductor, to measure a temperature of the conductor; and a charging/discharging control circuit electrically connected to the battery, to measure a voltage, electrically connected to two positions of the conductor, to measure a voltage between the two positions, electrically connected to the temperature sensor, to measure the temperature of the conductor, and electrically connected to the high-current path for charging/discharging of the battery, to switch on/off the charging/discharging switching element and simultaneously calculate the current flowing in the conductor by using the voltage and the temperature, measured from the conductor, as an input signal and to adjust a current capacity by calculating a capacity of the battery, flowing in the charging/discharging switching element.

Furthermore, the charging/discharging control circuit may include: a temperature compensated current detection part including a voltage detection part connected to the two positions of the conductor, to measure the voltage between the two positions, a temperature detection part electrically connected to the temperature sensor, to detect a voltage value corresponding to the temperature measured by the temperature sensor, and an arithmetic operation part converting the voltage value corresponding to the temperature, measured by the temperature detection part, into a resistance value of the conductor and calculating a current capacity, flowing in the conductor, by using the resistance value and the voltage between the two positions of the conductor measured by the voltage detection part; and a charging/discharging part electrically connected to the battery, to measure a voltage of the battery and electrically connected to the switching element and switch on/off the charging/discharging switching element for charging/discharging of the battery, calculate the charging/discharging capacity of the battery receiving a voltage of the battery and a current value of the battery by the temperature compensated current detection part, and adjust a current capacity flowing in the charging/discharging switching element.

According to another aspect of the present invention, the charging/discharging control circuit may include: a temperature compensated current detection part including a transducer electrically connected to the temperature sensor, to convert a detected resistance value of the temperature sensor into a voltage value, an A/D converter connected to the two positions of the conductor, to convert a measured analog voltage into a digital voltage, and a micro controller unit electrically connected to the transducer and the A/D converter, to receive the voltage value, output from the transducer and the A/D converter; and a charging/discharging part electrically connected to the battery, to measure a voltage of the battery and being electrically connected to the switching element and switch on/off the charging/discharging switching element for charging/discharging of the battery, calculate the charging/discharging capacity of the battery receiving a voltage of the battery and a current value of the battery by the temperature compensated current detection part, and adjust a current capacity flowing in the charging/discharging switching element. The charging/discharging switching element may be formed in a field effect transistor (FET). The temperature sensor may be formed in either a thermistor or an integrated circuit type temperature sensor.

According to another aspect of the present invention, the conductor may be extended along one direction with a uniform thickness and a width using the same material, and a resistance value of the conductor may increase according to an increase of the length and the resistance value thereof may change according to the temperature. In this case, the conductor may be formed in a conductive wire. The conductor may be formed of any one of copper (Cu), nickel (Ni), and gold (Au). The conductor may be a printed circuit pattern formed on an insulating substrate. When the conductor is the printed circuit pattern formed on the insulating substrate, the conductor, the temperature sensor, and the temperature compensated current detection circuit part may be provided on the same insulating substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
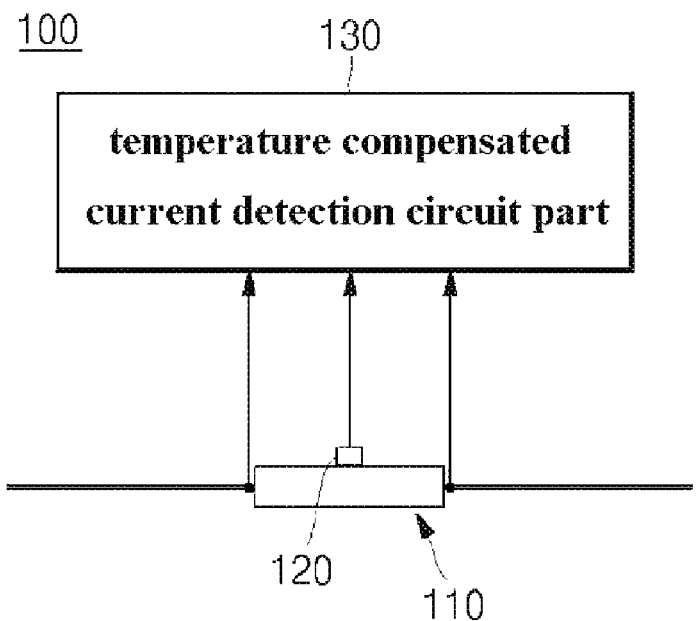
FIG. 1 is a circuit diagram of a temperature compensated current measuring device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a circuit diagram of a temperature compensated current measuring device according to an embodiment of the present invention.

Referring to FIG. 1, the temperature compensated current measuring device 100 according to an embodiment of the present invention may include a conductor 110, a temperature sensor 120, and a temperature compensated current detection circuit part 130.

If current flows in the conductor 110, the conductor 110 can be used. For example, the conductor 110 may be formed as a pattern of a high-current path of a printed circuit pattern of a circuit board, or a conductive wire. When the conductor 110 is formed in the conductive wire, the conductor 110 is generally used for a path in which high-current goes in and out. As a current magnitude value of the conductor 110 increases to a comparatively high-current, an error in measurement of the current due to a micro current is relatively reduced. Accordingly, when measuring the current by electrically connecting the temperature compensated current detection circuit part 130 to the conductor 110 formed in the conductive wire, it is possible to measure a relatively accurate current value.

Also, the conductor 110 may be formed in a printed circuit pattern formed on an insulating substrate. In this instance, the printed circuit pattern may be the path in which the very high-current goes in and out, like the conductive wire.

Also, the conductor 110 may be extended along one direction with a uniform thickness and a width using the same material, and a resistance value of the conductor 110 may increase according to an increase of the length and the resistance value thereof may change according to the temperature and provide a linear resistance value to the temperature compensated current detection circuit part 130.

Also, the conductor 110 may be formed of any one of copper (Cu), nickel (Ni), and gold (Au). In this instance, the conductor 110, formed of any of the above materials, has a strong characteristic that a rate of change of a resistance linearly increases according to an increase of the temperature. Accordingly, a relatively small error may occur due to temperature to be compensated for in a current value flowing in the conductor 110.

Also, the conductor 110, the temperature sensor 120, and the temperature compensated current detection circuit part 130 may be formed on the same insulating substrate. Particularly, the conductor 110 and the temperature sensor 120 may be formed to be adjacent to each other within the range where the conductor 110 and the temperature sensor 120 are not electrically connected to each other. The current flowing in the conductor 110 may be high-current which supplies a power to the temperature sensor 120 and the temperature compensated current detection circuit part 130. Accordingly, the conductor 110, the temperature sensor 120, and the temperature compensated current detection circuit part 130 may be formed on the same insulating substrate to thereby form the same ground potential.

Also, the temperature sensor 120 may be disposed around the conductor 110 to thereby measure a temperature of the conductor 110. For example, the temperature sensor 120 may be formed in a thermistor or an integrated circuit type temperature sensor, and be attached to the conductor 110 not to cause the short circuit therewith, thereby measure the temperature of the conductor 110.

The temperature compensated current detection circuit part 130 may be electrically connected to two positions of the conductor 110 and thereby measure a voltage between the two positions and the temperature measured by the temperature sensor 120. The temperature compensated current detection circuit part 130 has the connection relation as described above. Accordingly, the temperature compensated current detection circuit part 130 may obtain information about the voltage and the temperature, and measure the current flowing in the conductor 110, based on the information. More specifically, the temperature compensated current detection circuit part 130 is electrically connected to two positions of the conductor 110 and thereby detects the voltage of the conductor 110. In this instance, when a resistance value between the two positions of the conductor 110 is known, it is possible to know a current capacity flowing in the conductor 110. Accordingly, when the current capacity flowing in the conductor 110 changes, the voltage value also changes according thereto and thus it is possible to know the current capacity flowing in the conductor 110 based on the changed voltage value. Also, heat is generated from the conductor 110 according to the current capacity flowing in the conductor 110 and the amount of time current has been flowing whereby the resistance value of the conductor 110 changes. In this instance, the temperature sensor 120 disposed around the conductor 110, senses the temperature of the conductor 110. Also, the temperature compensated current detection circuit part 130 may receive the temperature sensed by the temperature sensor 120 and knows the rate of change of the resistance according to the temperature of the conductor 110, based on information about the sensed temperature. In this case, the temperature compensated current detection circuit part 130 detects a resistance of the conductor 110 by a previously memorized lookup table for temperature-resistance. The lookup table of temperature-resistance is formed by proportionally increasing resistance to temperature. As described above, since the temperature compensated current detection circuit part 130 may know the changed resistance value according to the voltage between two positions of the conductor 110 and the temperature of the conductor 110, the temperature compensated current detection circuit part 130 may calculate the actual current capacity according to the change in the temperature of the conductor 110. As such, the temperature compensated current detection circuit part 130 may be formed by electrically connecting a passive element, an active element, a logic element, an integrated circuit part, and the like, according to each function thereof.

Figure 2:
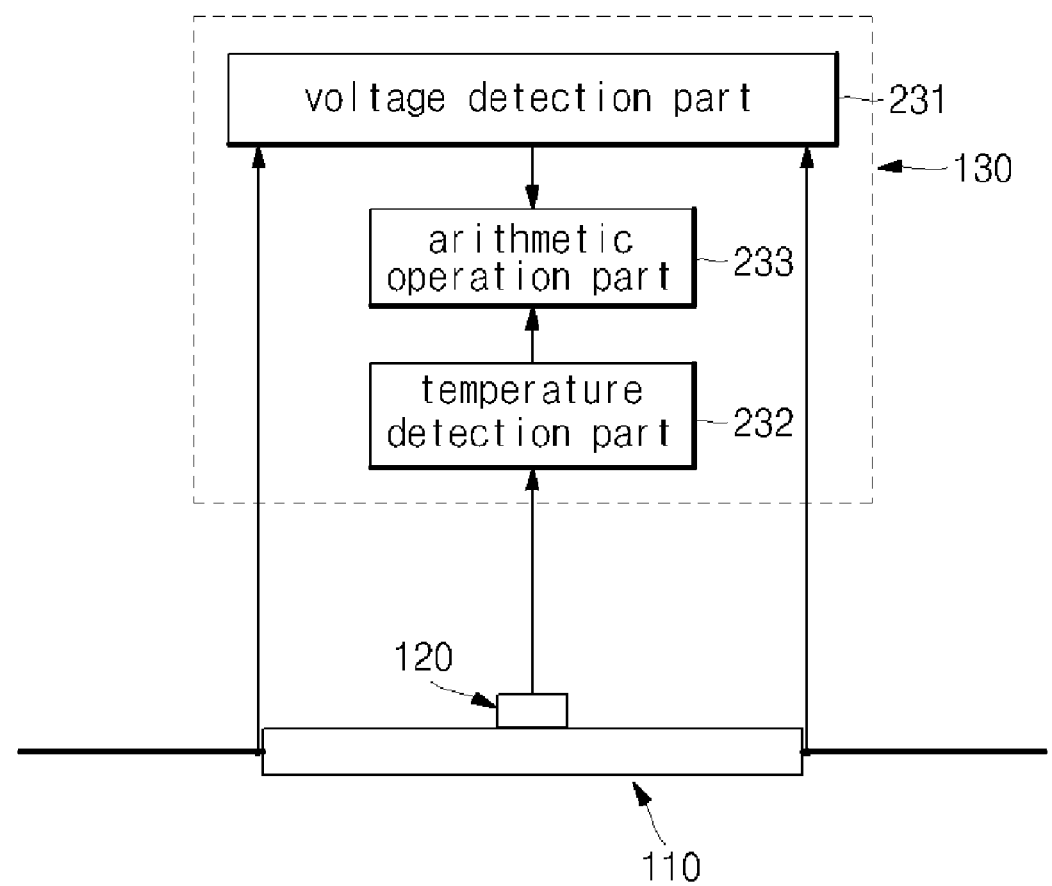
FIG. 2 is a circuit diagram of a temperature compensated current measuring device according to another embodiment of the present invention.

FIG. 2 is a circuit diagram of a temperature compensated current measuring device according to another embodiment of the present invention.

Referring to FIG. 2, a temperature compensated current measuring device 200 according to another embodiment of the present invention includes a conductor 110, a temperature sensor 120, and a temperature compensated current detection circuit part 130. Also, a temperature compensated current detection circuit part 130 may include a voltage detection part 231, a temperature detection part 232, and an arithmetic operation part 233.

The voltage detection part 231 may be connected to two positions of a conductor 110 and measure a voltage between the two positions. In this instance, the measured voltage may be sent to the arithmetic operation part 233 as a voltage value.

The temperature detection part 232 may be electrically connected to the temperature sensor 120 and detect a temperature detected by the temperature sensor 120. In this instance, the temperature detection part 232 may output a voltage value corresponding to the temperature, detected by the temperature sensor 120, to the arithmetic operation part 233.

The arithmetic operation part 233 may convert the voltage value corresponding to the temperature detected by the temperature detection part 232, into a resistance value of the conductor 110. Also, the arithmetic operation part 233 may calculate a current capacity flowing in the current 110, by using the voltage between the two positions of the conductor 110 measured by the voltage detection part 231, and the resistance value changed according to the change in the temperature of the conductor 110. In this instance, the arithmetic operation part 233 may be embedded with a lookup table which converts the voltage value into the resistance value of the conductor 110 according to the temperature measured by the temperature detection part 232. The arithmetic operation part 233 may calculate the resistance value of the conductor 110 according to the temperature of the conductor 110 by using the comparison table, and also may calculate the current capacity flowing in the conductor 110 by using the calculated resistance value and the voltage value between the two positions of the conductor 110.

The voltage detection part 231 and the temperature detection part 232 of the temperature compensated current detection circuit part 233 may be formed by electrically connecting a passive element, an active element, an integrated circuit, and the like according to each function thereof. Also, the arithmetic operation part 233 may be formed in a micro controller unit embedded with a program having a comparison function and an operation function. In this instance, a memory element may be electrically connected to an inside or outside of the arithmetic operation part 233. However, the configuration of the temperature compensated current detection circuit part 130 is not limited thereto.

Figure 3:
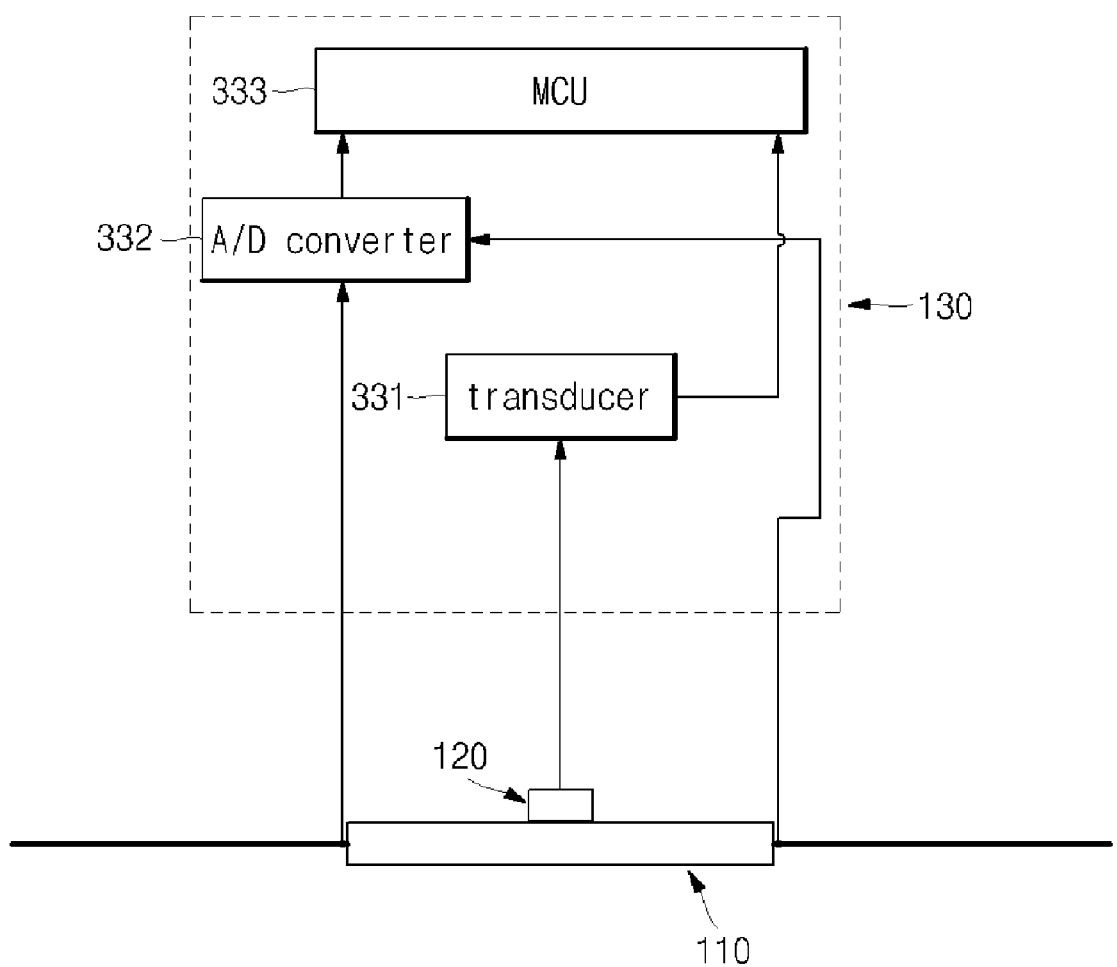
FIG. 3 is a circuit diagram of a temperature compensated measuring device according to still another embodiment of the present invention.

FIG. 3 is a circuit diagram of a temperature compensated current measuring device according to still another embodiment of the present invention.

Referring to FIG. 3, a temperature compensated current measuring device 300 according to still another embodiment of the present invention include conductor 110, a temperature sensor 120, a temperature compensated current detection circuit part 130. Also, a temperature compensated current detection circuit part 130 may include a transducer 331, an analog-to-digital (A/D) converter 332, and a micro controller unit (MCU) 333.

The transducer 331 may be electrically connected to a temperature sensor 120 and convert a detected resistance value of the temperature sensor into a voltage value. For example, the transducer 331 may be formed in a type of a Wheatstone bridge (not shown). In this instance, the temperature sensor 120 may be at least one resistance among four resistances of the Wheatstone bridge. As the temperature changes, the temperature sensor 120 electrically connected to the Wheatstone bridge may generate a resistance difference between Wheatstone bridges, and send the generated resistance value to the micro controller unit 333. Also, the transducer 331 may be formed in a type of an integrated circuit. However, the type of the transducer 331 is not limited thereto as described herein.

The A/D converter 332 may be electrically connected to two positions of a conductor 110 and thereby convert a measured analog voltage into a digital voltage, and output a value of the digital voltage to the micro controller unit 333.

The micro controller unit 333 may be electrically connected to the transducer 331 and the A/D converter 332, and thereby receive the voltage value output from the transducer 331 and the voltage value output from the A/D converter 332. The micro controller unit 333 stores the voltage value between the two positions of the conductor 110, output from the A/D converter 332, in an external memory or an internal memory, compares the voltage value according to the temperature received from the transducer 331, with the temperature-resistance lookup table stored in the external memory or the internal memory, and calculates the resistance value of the conductor 110. When the current capacity flowing in the conductor 110 is calculated by using the voltage value between the two positions of the conductor 110 and the resistance value, it is possible to know the current capacity flowing in the conductor 110, which is compensated according to the change in the temperature. In this instance, the micro controller unit 333 may process the voltage value and the temperature value in real time by using a digital signal processor with an improved signal processing function.

Figure 4:
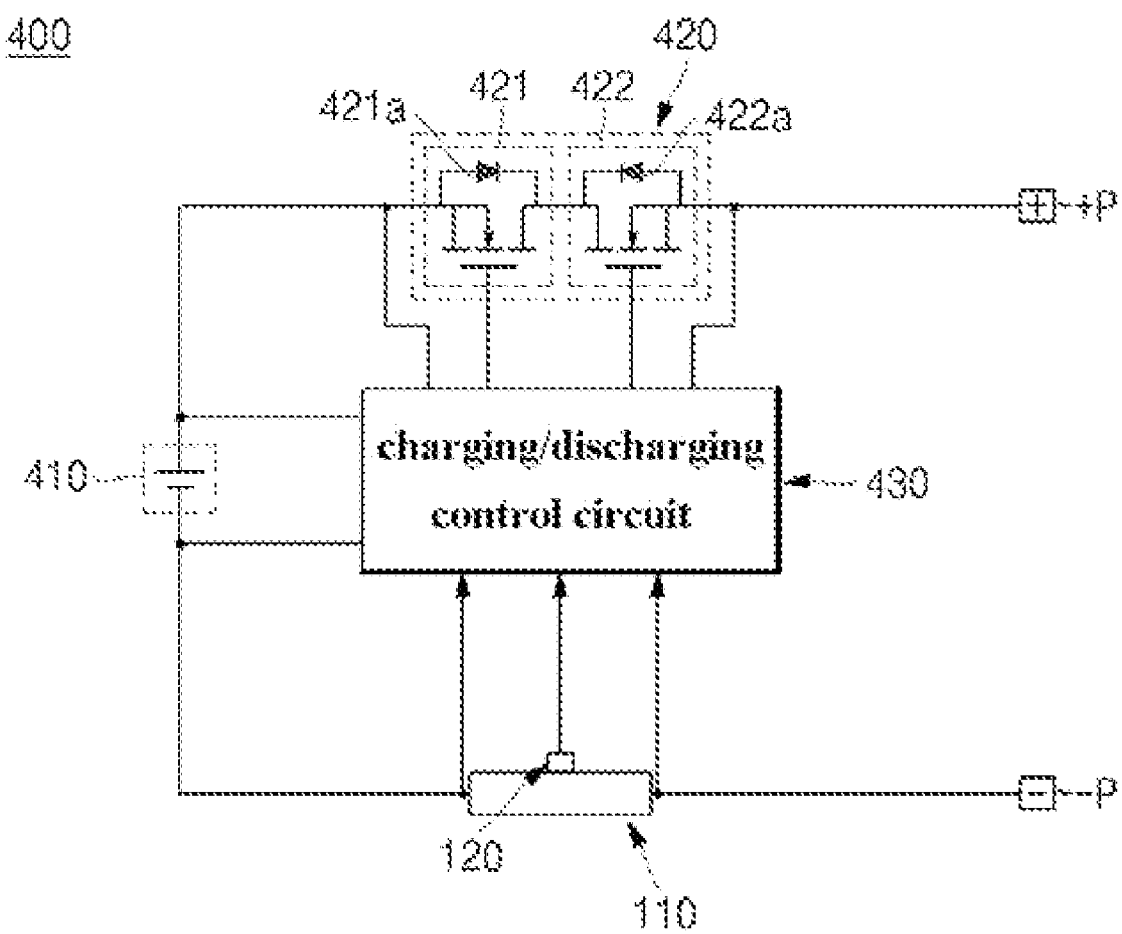
FIG. 4 is a circuit diagram of a battery pack according to an embodiment of the present invention.

FIG. 4 is a circuit diagram of a battery pack according to an embodiment of the present invention.

Referring to FIG. 4, the battery pack 400 according to the present invention may include a rechargeable battery 410, charging/discharging switching elements 420, a conductor 110, a temperature sensor 120, and a charging/discharging control circuit 430.

If the battery 410 is reachable, the battery 410 can be used. For example, the rechargeable battery 410 may be a lithium ion battery, a lithium ion polymer battery, and the like.

The charging/discharging switching elements 420 may include charging switching element 421 and discharging switching element 422. Also, the charging/discharging switching elements 420 may be electrically connected to a high-current path of the battery 410. Also, the high-current path may be a charging path or a discharging path of a charging/discharging terminal (+P, −P) which is connected to a battery receiving part of a portable electronics device or a charger (not shown). In this instance, the charging/discharging switching elements 420 may be formed in an N-channel type or P-channel type field effect transistor (FET), and thereby switch on/off charging/discharging paths via the charging/discharging control circuit 430. In this instance, the charging path and the discharging path are relative directions in which current flows to opposite directions. In this instance, to uni-directionally flow the charging path and the discharging path, parasitic diodes 421a and 422a are formed in the charging/discharging switching elements 420 respectively and, the parasitic diode 421 a coupled with the charging switching element 421 prevent the current flowing in the discharging path when the charging switching element 421 is switched on, and also the parasitic diode 422a coupled with the discharging switching element 422 prevent the current flowing in the charging path when the discharging switching element 422 is switched on.

The conductor 110 is electrically connected to the high-current path in which the current for charging/discharging of the battery 410 flows. Such a conductor 110 has the same configuration of the conductor 110 as described above, and thus repeated descriptions will be omitted herein.

The temperature sensor 120 is disposed around the conductor 110 and measures the temperature. The temperature sensor 120 is electrically connected to the charging/discharging control circuit 430 and transfers the temperature value of the conductor 110 to the charging/discharging control circuit part 430. In this instance, the temperature sensor 120 has been described above and thus repeated descriptions related thereto will be omitted herein.

The charging/discharging control circuit 430 is electrically connected to the two positions of the conductor 110 and measures a voltage. Also, the charging/discharging control circuit 430 is electrically connected to the temperature sensor 120 and measures the temperature, and measures the current, flowing in the conductor 110, by using the measured voltage and the temperature as an input signal. Also, the charging/discharging control circuit 430 is also electrically connected to the charging/discharging switching elements 420 and thereby switches on/off charging/discharging switching elements 420. A specific operation of the charging/discharging control circuit 430 may be divided in the case of charging and discharging. Specifically, in the case of charging, the charging/discharging control circuit 430 may switch on the charging switching element 421 and thereby connect the charging switching element 421 to the high-current path so that the battery 410 may be charged via a charger (not shown). Also, in the case of discharging, the charging/discharging control circuit 430 may switch on the discharging switching element 422 so that the battery 410 may supply a power to a portable electronics device. At the same time of controlling the charging/discharging paths, the charging/discharging control circuit 430 is embedded with a function of the temperature compensated current detection circuit part 130 of FIG. 1. Accordingly, the charging/discharging control circuit 430 may measure a charging/discharging current capacity flowing in the conductor 110 by using a voltage value between two points of the conductor 110 and a temperature value of the conductor 110.

Also, the charging/discharging control circuit 430 may calculate a life cycle of the battery 410 by detecting a voltage of the battery 410 and a current magnitude value of the battery 410. In this case, the charging/discharging control circuit 430 calculates a charging capacity of the battery 410 by continuously calculating a voltage and a current of the charging battery. Also, the charging/discharging control circuit 430 calculates a discharging capacity of the battery 410 by continuously calculating a voltage and a current of the discharging battery. The charging capacity and discharging capacity of the battery 410 as calculated by the calculating method is continuously accumulated and stored in the external memory or the internal memory. When the charging/discharging of the battery 410 has completed one-cycle, the charging/discharging control circuit 430 stores a count data of the battery-life cycle in the external memory or the internal memory. In this case, when a count of the battery-life cycle reaches the critical cycle, for example, a count of 100-cycles, the charging/discharging control circuit 430 determines the battery 410 is aged. At this time, the charging/discharging control circuit 430 controls a flowing current capacity of the charging switching element 421 to be low because of the life cycle of the battery 410. As a result, the life of the battery 410 may be extended. The battery pack 400 can charge the battery 410 with consideration to the life-cycle of the battery 410 by accurately detecting a current capacity for the battery 410.

Figure 5:
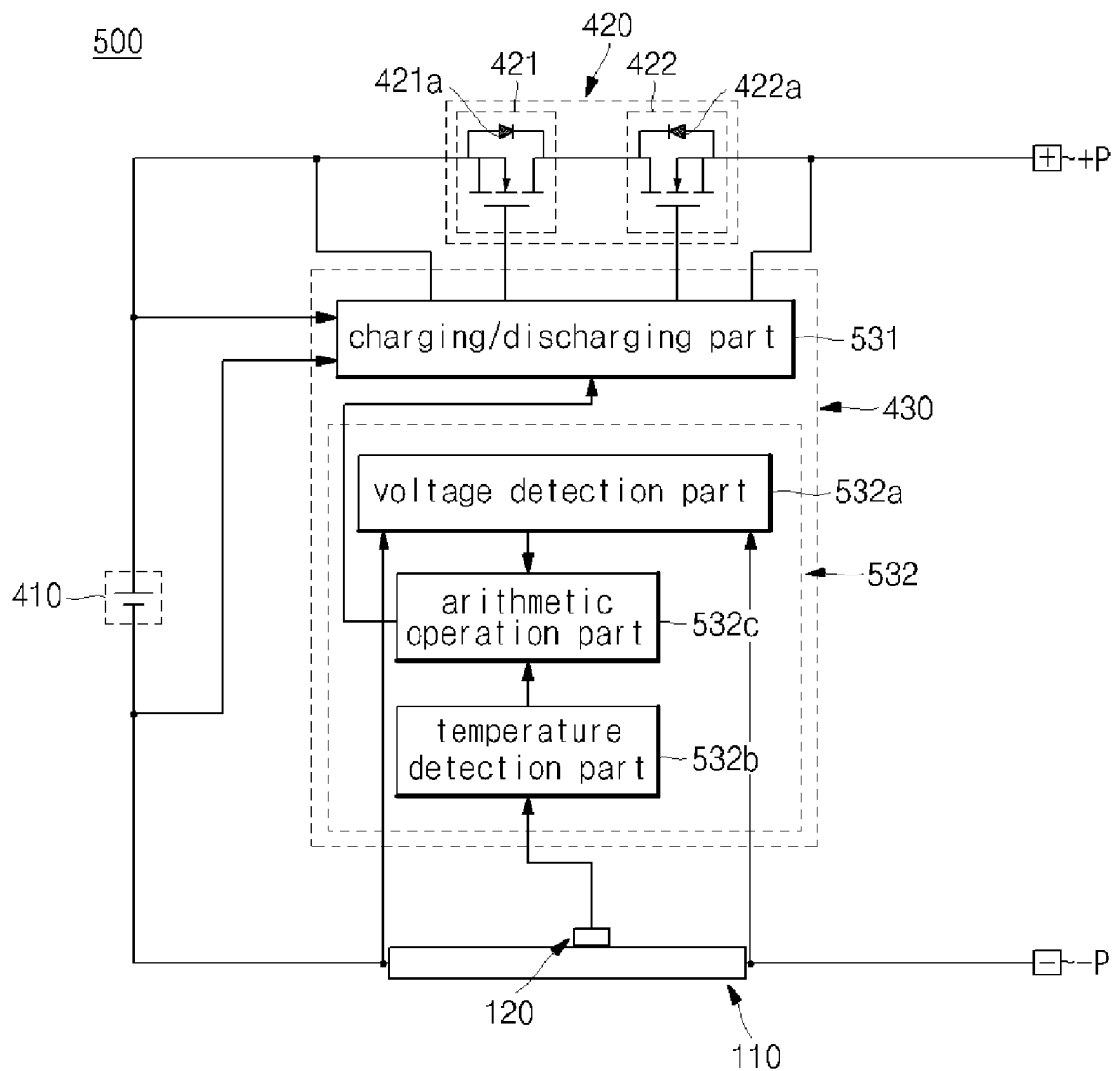
FIG. 5 is a circuit diagram of a battery pack according to another embodiment of the present invention.

FIG. 5 is a circuit diagram of a battery pack according to another embodiment of the present invention.

Referring to FIG. 5, the battery pack 500 according to the present invention includes a rechargeable battery 410, charging/discharging switching elements 420, a conductor 110, a temperature sensor 120, and a charging/discharging control circuit 430. Also, charging/discharging control circuit 430 includes a charging/discharging part 531 and a temperature compensated current detection part 532.

The charging/discharging part 531 may measure a voltage of a battery 110. Also, the charging/discharging part 531 may be electrically connected to charging/discharging switching elements 420 and a high-current path thereof and thereby switch on/off the charging/discharging switching elements 420. At the same time, the charging/discharging part 531 may adjust a current capacity of the charging/discharging switching elements 420. For example, when the charging/discharging switching elements 420 are formed in a FET, the charging/discharging part 531 may change a voltage of direct current (DC), which is applied to a gate and a source of the FET, and thereby adjust a current capacity flowing from the source to a drain. Also, by using the current capacity adjustment method, it is possible to control the charging/discharging switching elements 420 according to a current value flowing from the temperature compensated current circuit part to the conductor 110. In this instance, the charging/discharging part 531 may receive a signal corresponding to the current value from the temperature compensated current detection part 532, adjust the current capacity flowing in the charging/discharging switching elements 421 by using signal information and thereby effectively control charging/discharging of the battery 410. As such, the charging/discharging part 531 may be formed in a passive element, an active element, an integrated circuit, a micro controller unit, and the like. Also, the charging/discharging part 531 calculates a life-cycle of a life of the battery 410 by detecting a capacity of flowing current in charging/discharging and then the charging/discharging part 531 adjusts a capacity of flowing current about a life-cycle of the battery 410. In the instance, such a method of calculating by the charging/discharging part 531 has been described above and thus repeated descriptions related thereto will be omitted herein. The temperature compensated current detection part 532 may include a voltage detection part 532a, a temperature detection part 532b, and an arithmetic operation part 532c. In this instance, the voltage detection part 532a may be connected to the two positions of the conductor 110 and thereby measure the voltage between the two positions. The temperature detection part 532b may be electrically connected to the temperature sensor 120 and thereby detect a voltage value for the temperature measured by the temperature sensor 120. Also, the arithmetic operation part 532c may convert the voltage value corresponding to the temperature, measured by the temperature detection part 532b, into a resistance value of the conductor 110, and calculate a current capacity flowing in the conductor 110 by using the resistance value and the voltage between the two positions of the conductor 110 as measured by the voltage detection part 532a. In this instance, the arithmetic operation part 532c transfers the calculated current capacity to the charging/discharging part 531. The charging/discharging part 531 receives the current capacity and controls the charging/discharging switching elements 420 and thereby adjusts charging/discharging current capacity. As such, the temperature compensated current detection part 532 has been described above and thus repeated descriptions related to such will be omitted herein. The battery pack 500 can be charging the battery 410 with regards to the life-cycle of the battery 410 by the temperature compensated current detection part 532 accurately detecting a current capacity for the battery 410.

Figure 6:
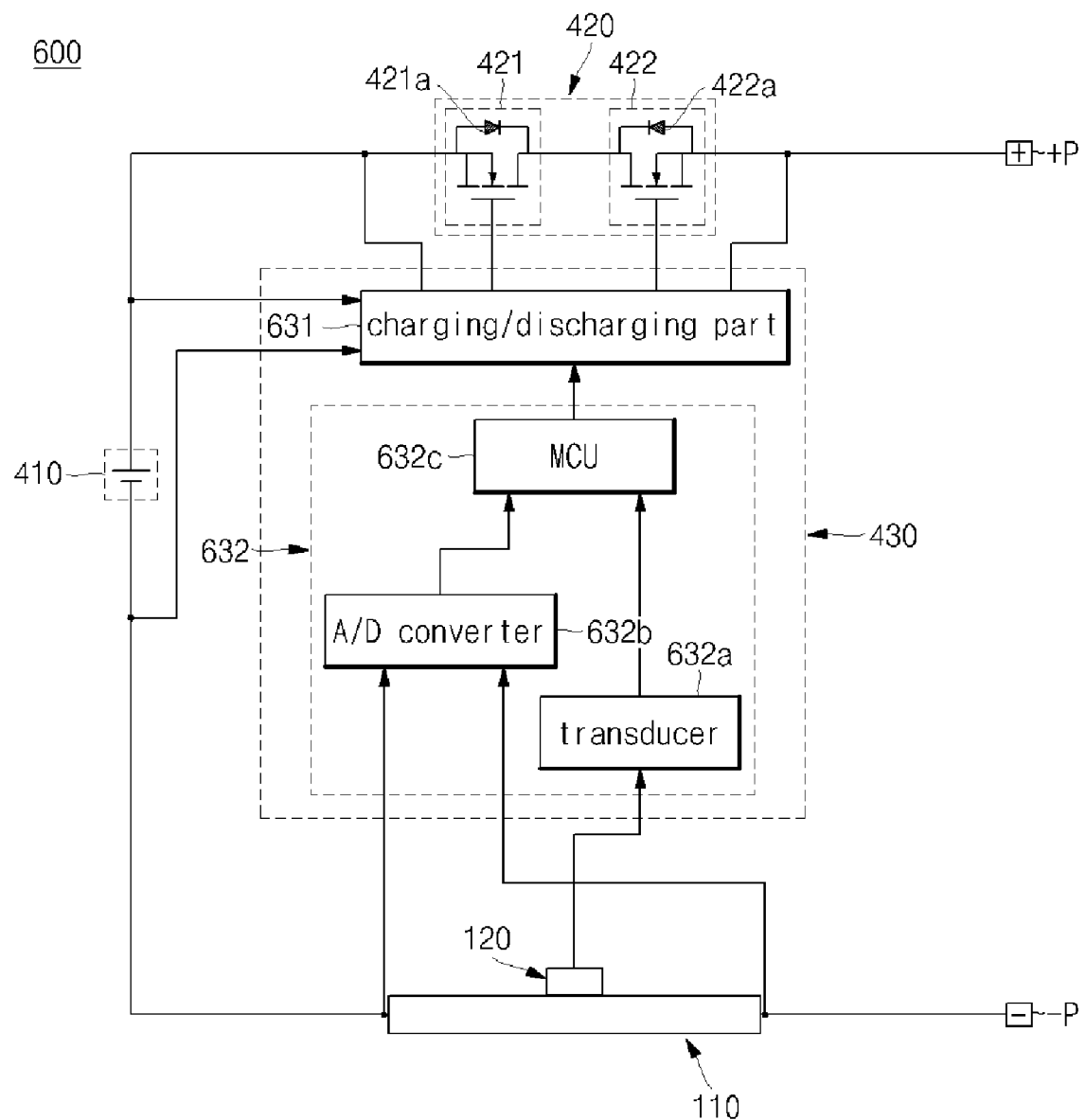
FIG. 6 is a circuit diagram of a battery pack according to still another embodiment of the present invention.

FIG. 6 is a circuit diagram of a battery pack according to another embodiment of the present invention.

Referring to FIG. 6, the battery pack 600, according to aspects of the present invention, includes a rechargeable battery 410, charging/discharging switching elements 420, a conductor 110, a temperature sensor 120, and a charging/discharging control circuit 430. Also, a charging/discharging control circuit 430 may include a charging/discharging part 631 and a temperature compensated current detection part 632.

The charging/discharging part 631 receives a signal corresponding to a charging/discharging current value flowing in a conductor 110, from a micro controller unit MCU 632c, and adjusts the charging/discharging current capacity of charging/discharging switching elements 420 based on the signal. Since the charging/discharging part 631 has the same functions as the above-described charging/discharging part, repeated descriptions related thereto will be omitted herein.

The temperature compensated current detection part 632 may include a transducer 632a, an A/D converter 632b, and the micro controller unit 632c. The transducer 632a may be electrically connected to a temperature sensor 120 and thereby convert a detected resistance value of the temperature sensor 120 into a voltage value. Also, the A/D converter 632b may be connected to two positions of the conductor 110 and thereby convert a measured analog voltage into a digital voltage. Also, the micro controller unit 632c may be electrically connected to the transducer 632a and the A/D converter 632b, and thereby receive the voltage value as outputted from the transducer 632a and the A/D converter 632b. As such, the temperature compensated current detection part 632, as constructed above, has been described with reference to FIG. 3 and thus repeated descriptions related thereto will be omitted herein and only an operational relation with the charging/discharging part 631 will be described. Firstly, the A/D converter 632b measures an analog voltage value flowing in the conductor 110, converts the detected analog voltage value into a digital voltage value, and transfers the converted digital signal value to the micro controller unit 632c. At the same time, the transducer 632a measures the temperature of the conductor 110 and outputs a voltage value corresponding to the temperature to the micro controller unit 632c. As described above, the micro controller unit 632c, which receives the voltage value between two positions of the conductor 110, and the signal corresponding to the temperature of the conductor 110, may calculate a charging/discharging current capacity flowing in the conductor 110 because the micro controller unit 632c already knows the voltage value between the two positions of the conductor 110 and the resistance value according to the temperature of the conductor 110. When the calculated current capacity is transferred to the charging/discharging part 631, the charging/discharging part 631 may adjust the current capacity flowing in the charging/discharging switching elements 420 and thereby adjust the charging/discharging current capacity with respect to a life-cycle of the battery 410. Additionally, the micro controller unit 632c may be integrally formed with the charging/discharging part 631 and thereby simultaneously perform control of the charging/discharging and calculation of the charging discharging current capacity. The battery pack 600 can be charging the battery 410 with respect to the life-cycle of the battery 410 by the temperature compensated current detection part 632 accurately detecting a current capacity for the battery 410.

As described above, according to aspects of the present invention, it is possible to measure a voltage between two positions of a conductor in which current flows and a temperature of the conductor, thereby accurately calculating an actual current and charge flowing in the conductor.

Also, according to aspects of the present invention, there is provided a battery pack which may remove an external resistance, which is included in a conventional charging/discharging control circuit, and thus may reduce a production cost, and also may accurately calculate current flowing in charging/discharging paths and thereby effectively control charging/discharging of a battery.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:
1. A battery pack comprising:
 a rechargeable battery;
 a charging/discharging switching element electrically connected to a high-current path of the rechargeable battery;
 a conductor electrically connected to the high-current path in which a current for charging/discharging of the rechargeable battery flows;
 a temperature sensor disposed around the conductor to measure a temperature of the conductor; and
 a charging/discharging control circuit electrically connected to the rechargeable battery to measure a voltage of the rechargeable battery, electrically connected to two positions of the conductor to measure a voltage between two positions of the conductor, and electrically connected to the temperature sensor to measure the temperature of the conductor;
 wherein the charging/discharging control circuit is programmed to calculate a charging/discharging current flowing in the conductor by using a previously memorized lookup table for temperature resistance, the measured voltage between the two positions of the conductor, and the temperature measured from the conductor as input signals; and to adjust the charging/discharging current flowing in the charging/discharging switching element according to the previously memorized lookup table for temperature-resistance, the measured voltage between the two positions of the conductor, the voltage of the rechargeable battery and the temperature measured from the conductor.

2. The battery pack according to claim 1, wherein the charging/discharging control circuit comprises:
 a temperature compensated current detection part comprising:
 a voltage detection part connected to the two positions of the conductor to measure the voltage between the two positions;
 a temperature detection part electrically connected to the temperature sensor to detect a voltage value corresponding to the temperature measured by the temperature sensor; and
 an arithmetic operation part for converting the voltage value corresponding to the temperature measured by the temperature detection part into a resistance value of the conductor by using the previously memorized lookup table for temperature-resistance and for calculating the charging/discharging current flowing in the conductor by using the resistance value and the voltage between the two positions of the conductor measured by the voltage detection part; and
 a charging/discharging part electrically connected to the rechargeable battery to measure the voltage of the rechargeable battery, electrically connected to the charging/discharging switching element and the high-current path for charging/discharging of the rechargeable battery, electrically connected to receive a current volute of the charging/discharging current from the temperature compensated current detection part, and electrically connected to the charging/discharging switching element to adjust the charging/discharging current flowing in the charging/discharging switching element.

3. The battery pack according to claim 1, wherein the charging/discharging control circuit comprises:
 a temperature compensated current detection part comprising:
 a transducer electrically connected to the temperature sensor to convert a detected resistance value of the temperature sensor into a voltage value;
 an A/D converter connected to the two position of the conductor to convert a measured analog voltage into a digital voltage; and
 a micro controller unit electrically connected to the transducer and the A/D converter to receive the voltage value output from the transducer and the A/D converter; and
 a charging/discharging part electrically connected to the rechargeable battery to measure the voltage of the rechargeable battery, electrically connected to the charging/discharging switching element to switch on/off the charging/discharging switching element, electrically connected to receive a current value of the charging/discharging current from the temperature compensated current detection part, and electrically connected to the charging/discharging switching element to adjust the charging/discharging current flowing in the charging/discharging switching element.

4. The battery pack according to claim 1, wherein the charging/discharging switching element is formed in a field effect transistor (FET).

5. The battery pack according to claim 1, wherein the conductor is formed in a conductive wire.

6. The battery pack according to claim 1, wherein the conductor is a printed circuit pattern formed on an insulating substrate.

7. The battery pack according to claim 1, wherein the conductor is formed of one selected from the group consisting of copper, nickel, and gold.

8. The battery pack according to claim 1, wherein the conductor is extended along one direction with a uniform thickness and a width using the same material, and a resistance value of the conductor increases according to an increase of the length and the resistance value thereof changes according to the temperature.

9. The battery pack according to claim 1, wherein the temperature sensor is formed in one of a thermistor or an integrated circuit type temperature sensor.

10. The battery pack according to claim 1, wherein the two positions of the conductor electrically connected to the charging/discharging control circuit are at two ends of the conductor, and the temperature sensor is arranged on the conductor and between the two positions of the conductor.

11. The battery pack according to claim 1, wherein the charging/discharging control circuit is further programmed to calculate a life cycle of the rechargeable battery by using the measured voltage of the rechargeable battery and the calculated charging/discharging current, and electrically connected to the charging/discharging switching element to further adjust the charging/discharging current flowing in the charging/discharging switching element according to the life cycle of the rechargeable battery.

* * * * *

UNITED STATES PATENT AND TRADEMARK OFFICE
CERTIFICATE OF CORRECTION

| | |
|---|---|
| PATENT NO. | : 8,173,287 B2 |
| APPLICATION NO. | : 12/238563 |
| DATED | : May 8, 2012 |
| INVENTOR(S) | : Sesub Sim |

It is certified that error appears in the above-identified patent and that said Letters Patent is hereby corrected as shown below:

In the Claims

Column 12, Claim 2, line 42　　　　　　Delete "volute"
　　　　　　　　　　　　　　　　　　　　Insert -- value --

Signed and Sealed this
Twenty-fifth Day of February, 2014

Michelle K. Lee
*Deputy Director of the United States Patent and Trademark Office*